United States Patent

Roh

Patent Number: 5,958,797
Date of Patent: Sep. 28, 1999

[54] PLANARIZATION OF A PATTERNED STRUCTURE ON A SUBSTRATE USING AN ION IMPLANTATION-ASSISTED WET CHEMICAL ETCH

[75] Inventor: Jae-Woo Roh, Seoul, Rep. of Korea

[73] Assignee: Daewoo Electronics, Co., Inc., Seoul, Rep. of Korea

[21] Appl. No.: 08/716,757

[22] Filed: Sep. 23, 1996

[30] Foreign Application Priority Data

Sep. 30, 1995 [KR] Rep. of Korea .................... 95-33524

[51] Int. Cl.$^6$ .................... H01L 21/311; H01L 21/469
[52] U.S. Cl. .................... 438/697; 438/745; 438/706; 438/778; 438/699; 216/38
[58] Field of Search .................... 438/106, 637, 438/700, 760, 778, 369, 370, 757, 766, 745, 697, 713, 699, 758, 756; 216/38, 67, 87, 88

[56] References Cited

U.S. PATENT DOCUMENTS

| | | |
|---|---|---|
| 4,634,494 | 1/1987 | Taji et al. .................... 438/705 |
| 4,944,682 | 7/1990 | Cronin et al. .................... 438/637 |
| 5,019,526 | 5/1991 | Yamane et al. .................... 438/440 |
| 5,068,207 | 11/1991 | Manocha et al. .................... 438/697 |
| 5,413,953 | 5/1995 | Chien et al. .................... 438/443 |
| 5,429,990 | 7/1995 | Liu et al. .................... 438/637 |
| 5,575,886 | 11/1996 | Murase .................... 438/692 |
| 5,698,467 | 12/1997 | Sakao et al. .................... 438/699 |
| 5,879,862 | 3/1999 | Roh .................... 438/697 |

*Primary Examiner*—Savitri Mulpuri
*Attorney, Agent, or Firm*—Pennie & Edmonds LLP

[57] ABSTRACT

A method for planarizing a patterned structure on a top surface of a substrate comprises the steps of depositing an insulating layer on the patterned structure, implanting ionized atoms of a predetermined depth onto the surface of the insulating layer, coating a photo resist on the insulating layer and partially removing the photo resist so that a portion of the insulating layer on the patterned structure is unmasked at a substantially same magnitude of lateral length as a width of the patterned structure, exposing the unmasked portion of the insulating layer to an etchant until the unmasked portion of the insulating layer is removed to be generally flushed with the remainder of the insulating layer and removing the photo resist from the insulating layer. The method further comprises the steps of repeatedly performing etch back processes, after the removing step.

5 Claims, 5 Drawing Sheets

PLANARIZATION OF A PATTERNED STRUCTURE ON A SUBSTRATE USING AN ION IMPLANTATION-ASSISTED WET CHEMICAL ETCH

FIELD OF THE INVENTION

The present invention is directed to a planarization process; and, more particularly, to an improved method for planarizing a layer having a patterned structure on top of a substrate.

DESCRIPTION OF THE PRIOR ART

Most of today's integrated circuits (ICs) are multilayered to include a plurality of conductive layers, interconnecting layers, etc. In forming a multilayered IC, there are bound to occur layers with a non-planar topography, which are known to cause a number of defects, e.g., voids, in the multilayered IC which may, in turn, adversely affect the performance thereof.

To obviate these defects, the layers constituting the multilayered ICs are often planarized. One of the conventional methods for planarizing a layer is to repeatedly perform depositing and etching, e.g., a photo resist until a satisfactory planar topography is obtained as illustrated in FIGS. 1A to 1C.

Referring to FIG. 1A, an insulating layer 13 made of, e.g., silicon oxide is first deposited on top of a substrate having a patterned structure 12 on top thereof in such a way that the layer 13 completely covers the patterned structure 12, thereby giving rise to a protuberance 13'. Then a photo resist layer 14 is deposited on top of the insulating layer 13 including the protuberance 13', as shown in FIG. 1B. As a result of the fluidity of the photo resist, a portion 14' of the photo resist layer 14 becomes less pronounced as compared with the protuberance 13' of the insulating layer 13. Thereafter, the photo resist layer 14 and the protuberance 13' of the insulating layer 13 are etched by using a dry etching method. An etchant therefor is selected such that it removes the photo resist layer 14 and the protuberance 13' of the insulating layer 13 at a nearly identical rate, resulting in the protuberance 13' becoming less pronounced after the etching, as shown in FIG. 1C. The depositing and the etching processes described above are repeatedly performed until a satisfactory topography is obtained.

The prior art planarization method described above, however, has a shortcoming in that it takes too long to obtain the satisfactory topography.

SUMMARY OF THE INVENTION

It is, therefore, a primary object of the present invention to provide an improved method capable of planarizing a particular surface at a greatly reduced time period.

In accordance with the present invention, there is provided a method for planarizing a patterned structure on a top surface of a substrate, said method comprising the steps of: (a) depositing an insulating layer on the patterned structure; (b) coating a photo resist on the insulating layer and partially removing the photo resist so that a portion of the insulating layer on the patterned structure is unmasked at a substantially same magnitude of lateral length as a width of the patterned structure; (c) exposing the unmasked portion of the insulating layer to an etchant until the unmasked portion of the insulating layer is removed to be generally flushed with the remainder of the insulating layer; and (d) removing the photo resist from the insulating layer.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE PREFERRED EMBODIMENTS

FIGS. 2A to 2H illustrate cross sectional views setting forth a method for planarizing a layer having a non-planar topography in accordance with the present invention.

Figure 1A:
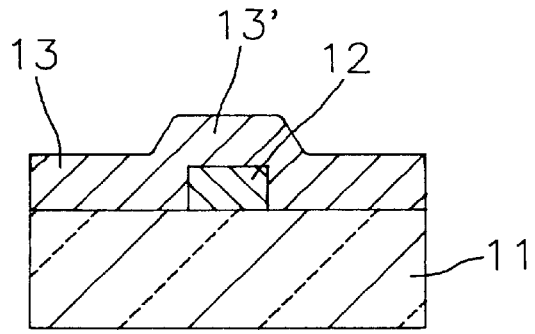
FIGS. 1A to 1C set forth a prior art method for planarizing a layer having a non-planar topography.
Figure 1B:
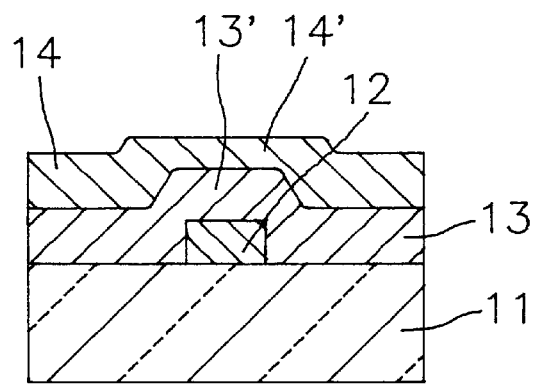
Figure 1C:
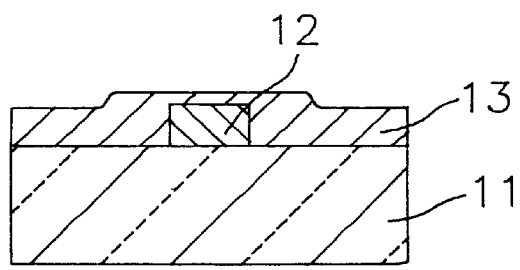
Figure 2A:
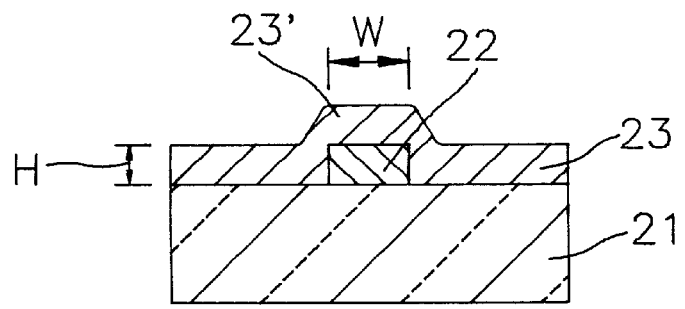
FIGS. 2A to 2H depict a method for planarizing a layer having a non-planar topography in accordance with the present invention.

Referring to FIG. 2A, there is shown a substrate 21 with a patterned structure 22 with a height H and an width W formed on top thereof, wherein the patterned structure 22 may be of any structure, for example, a conductive line, a device, etc.

A first step of the inventive planarizing method is to deposit an insulating layer 23 on top of the substrate in such a way that it completely covers the patterned structure 22 formed on top of the substrate 21, resulting in the insulating layer 23 having a protuberance 23' due to the presence of the patterned structure 22. The insulating layer 23 made of an insulating material, e.g., silicon oxide, is deposited on top of the substrate 21 by using a chemical vapor deposition.

Figure 2B:
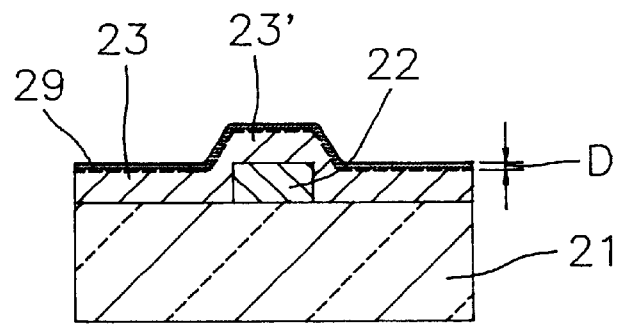

A second step constituting the inventive planarizing method is to implant ionized atoms into the insulating layer 23, as shown in FIG. 2B. This process is performed throughout the entire surface of the insulating layer 23 to thereby form an implanted surface region 29 of a predetermined depth D. The implanted surface region 29 represents a region in the insulating layer 23, which contains an increased number of defects resulting from the ion implantation. The depth of the implanted surface region 29 preferably ranges from 100 Å to 200 Å.

Figure 2C:
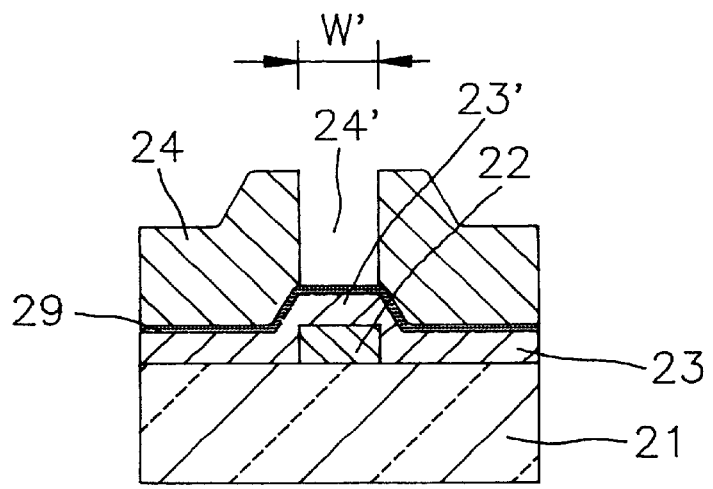

A third step of the inventive planarizing method is to coat a photo resist layer 24 on top of the ion-implanted insulating layer 23, and to remove a portion 24' of the photo resist layer 24 located on top of the patterned structure 22 to thereby reveal a portion of the protuberance 23', i.e., unmasked, as shown in FIG. 2C, by employing a photolithography method. In removing the portion 24', it is required that the width W' thereof be similar to or of the same size as the width W of the patterned structure 22. The photo resist layer 24 thus patterned on top of the insulating layer 23 in this manner serves as a mask-layer for a wet chemical etching process to be followed.

Figure 2D:
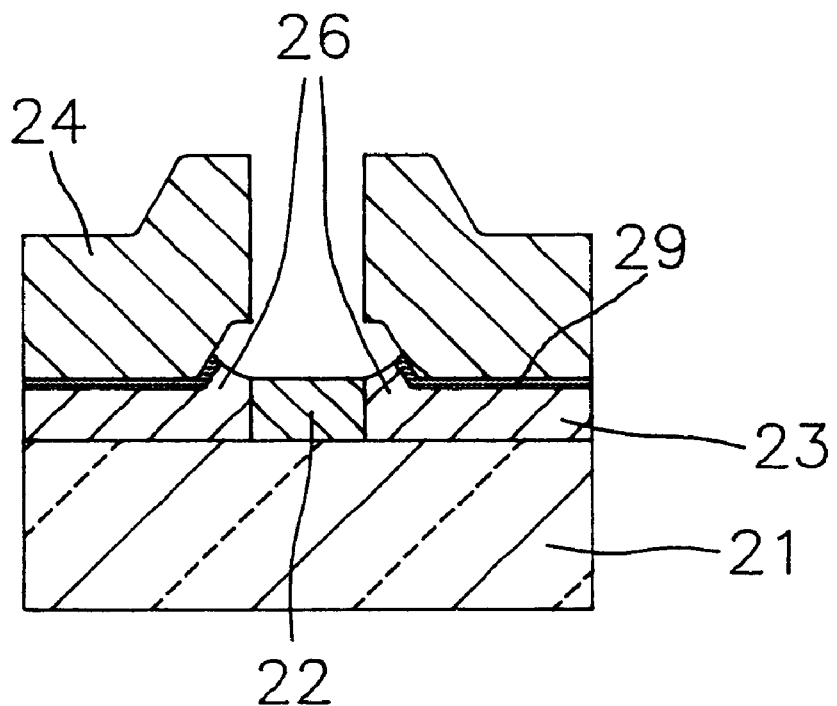

A fourth step of the inventive planarizing method resides in the wet chemical etching wherein the unmasked portion of the insulating layer 23 is exposed to an etchant. The unmasked portion is exposed to the etchant, until the protuberance 23' of the insulating layer 23 is removed to thereby be substantially flushed with the remainder portion of the insulating layer 23. As a result, a pair of bumps 26 are left on the insulating layer, as shown in FIG. 2D.

In the course of the wet etching, the defects produced in the implanted surface region 29 of the insulating layer 23 permit the etchant to more easily attack along the implanted surface region 29, causing an increase in the etching rate along the implanted surface region 29. This effectively reduces the height of the bumps 26 left. In other words, the planarization of the surface by the wet chemical etching wherein the surface of the insulating layer 23 is subjected to the ion implantation is much more effective than that by a wet chemical etching wherein the surface of the insulating layer 23 is not exposed to the ion implantation.

Figure 3A:
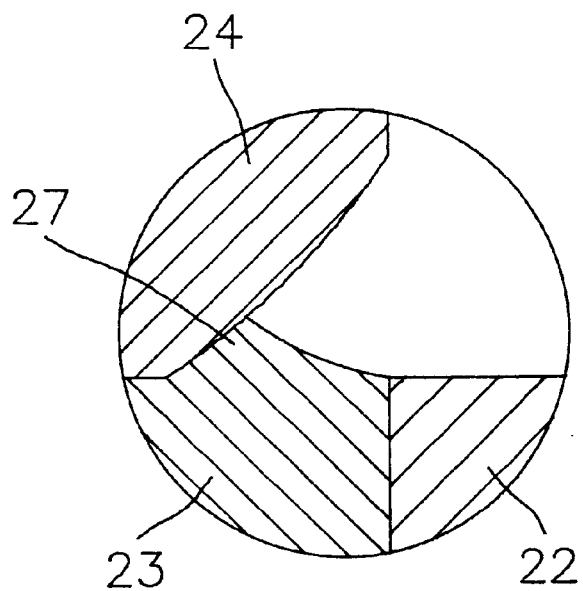
FIG. 3A offers an edge profile resulting from a wet chemical etching without an ion implantation step performed prior thereto.
Figure 3B:
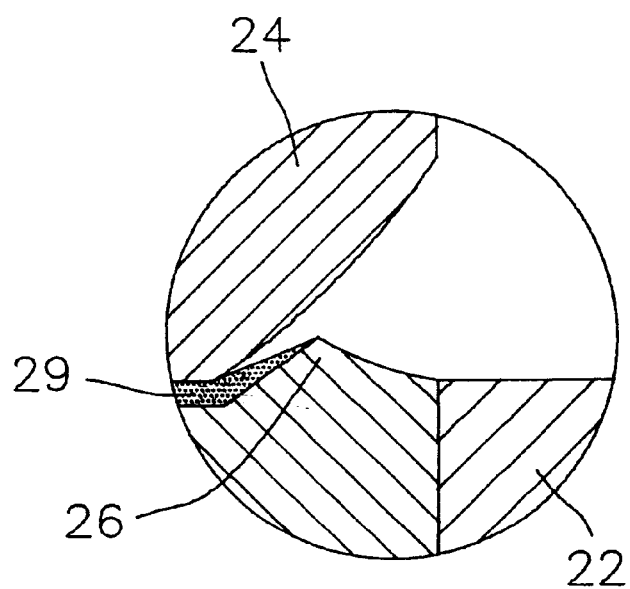
FIG. 3B presents an edge profile resulting from a wet chemical etching, with the ion implantation step performed prior thereto.

For a comparison between the two methods, a bump 27 resulted from the wet etching wherein the surface of the insulating layer 23 is not exposed to the ion implantation is illustrated in FIG. 3A; and a bump 26 caused by the wet chemical etching wherein the surface of the insulating layer is subjected to the ion implantation is depicted in FIG. 3B. The etching in FIG. 3A is nearly isotropically proceeded, while in FIG. 3B, a gap is developed between the bump 26 and the photo resist layer 24 due to a higher etching rate along the implanted surface region 29 of the insulating layer 23, resulting in a height of the bump 26 being lower than that of the bump 27.

On the other hand, a mixture solution of $NH_4F$, HF and $H_2O$ is normally used as the etchant. As well known, the more diluted said HF is made in the mixture solution, the more planar topography there is obtained on the insulating layer 23. In accordance with the present invention, a water solution of, e.g, a 30:1 volume ratio of $NH_4F$:HF may be used as the etchant.

Figure 2E:
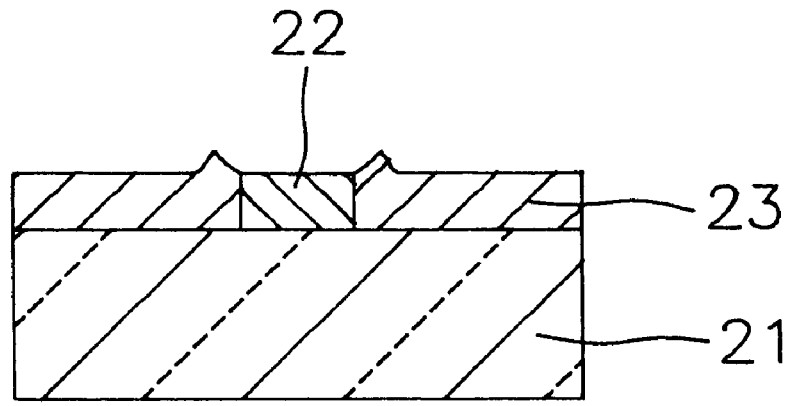

A fifth step of the inventive planarizing method is to remove the photo resist layer 24 left on top of the insulating layer 23. As can be seen in FIG. 2E, the insulating layer 23 has much more planarized topography than when it was initially deposited on the patterned structure 22, shaping the protrusion 23', as shown in FIG. 2A.

Figure 2F:
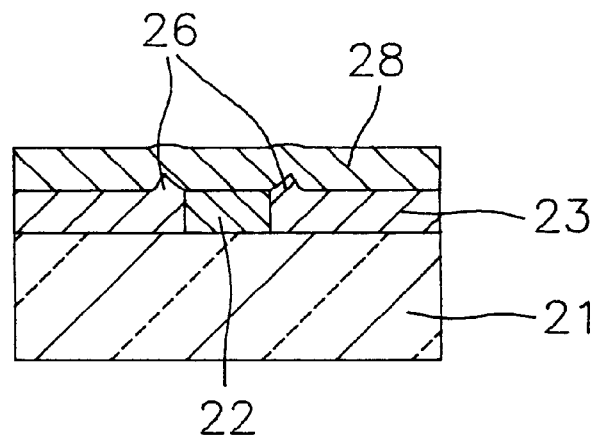
Figure 2G:
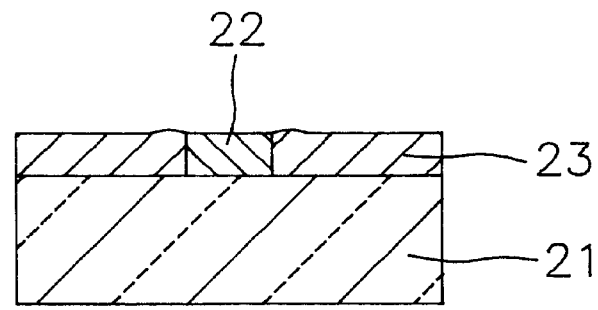
Figure 2H:
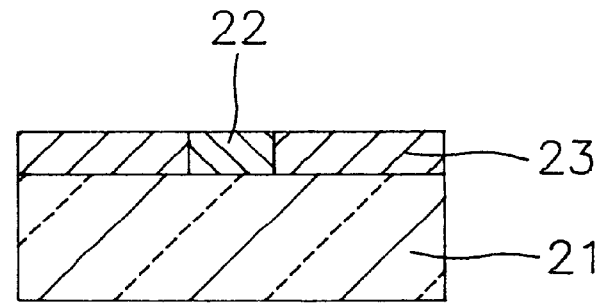

Finally, the well known etch back processes are repeatedly performed to the top surface of the insulating layer 23, from which the photo resist layer 24 has been removed. By way of illustration, a photo resist layer 28 is coated on the insulating layer 23 as a sacrificial coating, as shown in FIG. 2F. As a result of the coating operation, a top surface of the photo resist layer 28 comes to be more planarized than that of the insulating layer 23 in FIG. 2E, due to its fluidity. Then the photo resist layer 28 together with the bumps 26 is etched by means of, e.g., a dry etching. An etchant to be used is chosen to have a nearly identical etching rate for both the photo resist layer 28 and the insulating layer 23. Due to the substantially same etching rate, the top surface of the insulating layer 23 becomes topographically same as the original top surface of the photo resist layer 28, when the etching is completed. In other words, the top surface of the insulating layer 23 is more planarized than after the fifth step, as shown in FIG. 2G. These coating and etching processes are repeated until a satisfactory planar topography as shown in FIG. 2H is obtained.

Although the invention has been shown and described with respect to the preferred embodiments, it will be understood by those skilled in the art that various changes and modifications may be made without departing from the spirit and scope of the invention as defined in the following claims.

What is claimed is:

1. A method for planarizing a patterned structure on a top surface of a substrate, said method comprising the sequential steps of:

(a) depositing an insulating layer on the patterned structure and adjacent portions of the substrate, said insulating layer having a protuberance in a region above said patterned structure;

(b) implanting ions at a predetermined depth into an upper portion of said insulating layer, said insulating layer being uncovered while being implanted with said ions;

(c) depositing a first coverage material on top of the ion-implanted insulating layer;

(d) removing that portion of the first coverage material which is directly above the patterned structure to thereby expose the ion-implanted insulating layer directly above the patterned structure, wherein the exposed ion-implanted portion has a substantially same magnitude of lateral length as a width of the patterned structure;

(e) etching the exposed ion-implanted insulating layer which is directly above the patterned structure by a wet chemical etch until said exposed ion-implanted insulating layer is removed;

(f) removing the first coverage material covering the insulating layer on top of the substrate such that both the patterned structure and the insulating layer are exposed, (g) depositing a second coverage material on top of said patterned structure and insulating layer; and (h) etching the second coverage material with an etchant having an etch rate which is substantially the same for the insulating material and the coverage material further planarize the insulation layer.

2. The method of claim 1, wherein the insulating layer is deposited by using a chemical vapor deposition.

3. The method of claim 1, wherein the coverage material is a photo resist.

4. The method of claim 1, wherein the implantation depth of the ion ranges from 100 Å to 200 Å.

5. The method of claim 1 wherein a dry chemical etch is used to remove the second coverage material.

* * * * *